United States Patent
Huang et al.

(10) Patent No.: US 11,018,003 B2
(45) Date of Patent: May 25, 2021

(54) METHOD OF SELECTIVE SILICON GERMANIUM EPITAXY AT LOW TEMPERATURES

(71) Applicant: Applied Materials, Inc., Santa Clara, CA (US)

(72) Inventors: Yi-Chiau Huang, Fremont, CA (US); Hua Chung, San Jose, CA (US)

(73) Assignee: APPLIED MATERIALS, INC., Santa Clara, CA (US)

(*) Notice: Subject to any disclaimer, the term of this patent is extended or adjusted under 35 U.S.C. 154(b) by 0 days.

(21) Appl. No.: 16/513,301

(22) Filed: Jul. 16, 2019

(65) Prior Publication Data

US 2020/0035489 A1  Jan. 30, 2020

Related U.S. Application Data

(60) Provisional application No. 62/711,876, filed on Jul. 30, 2018.

(51) Int. Cl.
*H01L 21/02* (2006.01)
*H01L 21/306* (2006.01)
*H01L 29/66* (2006.01)

(52) U.S. Cl.
CPC .. *H01L 21/02636* (2013.01); *H01L 21/02381* (2013.01); *H01L 21/02532* (2013.01); *H01L 21/30604* (2013.01); *H01L 29/66795* (2013.01)

(58) Field of Classification Search
CPC .......... H01L 21/0262; H01L 21/02636; H01L 21/02532; H01L 21/02576; H01L 21/02579; C23C 16/00
See application file for complete search history.

(56) References Cited

U.S. PATENT DOCUMENTS

| | | | |
|---|---|---|---|
| 6,958,253 B2 | 10/2005 | Todd | |
| 7,132,338 B2 | 11/2006 | Samoilov et al. | |
| 7,166,528 B2 | 1/2007 | Kim et al. | |
| 7,682,947 B2 | 3/2010 | Brabant et al. | |
| 8,821,635 B2 | 9/2014 | Kouvetakis et al. | |
| 9,929,055 B2 | 3/2018 | Dube et al. | |
| 2003/0124761 A1* | 7/2003 | Baert | C23C 16/22 438/50 |
| 2011/0124169 A1* | 5/2011 | Ye | C30B 25/18 438/299 |

(Continued)

FOREIGN PATENT DOCUMENTS

WO     2007120866 A2     10/2007

OTHER PUBLICATIONS

International Search Report and Written Opinion for Application No. PCT/US2019/041895 dated Nov. 11, 2019.

*Primary Examiner* — Michael M Trinh
(74) *Attorney, Agent, or Firm* — Patterson + Sheridan LLP

(57) ABSTRACT

In an embodiment, a method of selectively depositing a silicon germanium material on a substrate is provided. The method includes positioning the substrate within a substrate processing chamber, the substrate having a dielectric material and a silicon containing single crystal thereon; maintaining the substrate at a temperature of about 450° C. or less; exposing the substrate to a process gas comprising: a silicon source gas, a germanium source gas, an etchant gas, a carrier gas, and at least one dopant source gas; and epitaxially and selectively depositing a first silicon germanium material on the substrate.

21 Claims, 5 Drawing Sheets

(56) References Cited

U.S. PATENT DOCUMENTS

| | | |
|---|---|---|
| 2012/0295417 A1 | 11/2012 | Adam et al. |
| 2012/0295421 A1* | 11/2012 | Brabant ............ H01L 21/02532 |
| | | 438/478 |
| 2014/0024204 A1* | 1/2014 | Hikavyy ........... H01L 21/02636 |
| | | 438/494 |
| 2014/0045324 A1* | 2/2014 | Brabant .................. C30B 25/02 |
| | | 438/507 |
| 2014/0206180 A1* | 7/2014 | Hasebe ............. H01L 21/02636 |
| | | 438/485 |
| 2015/0247259 A1 | 9/2015 | Hekmatshoar-Tabari et al. |

* cited by examiner

METHOD OF SELECTIVE SILICON GERMANIUM EPITAXY AT LOW TEMPERATURES

CROSS-REFERENCE TO RELATED APPLICATIONS

This application claims benefit of U.S. Provisional Patent Application Ser. No. 62/711,876, filed Jul. 30, 2018, the entirety of which is herein incorporated by reference.

BACKGROUND

Field

Embodiments of the present disclosure generally relate to a semiconductor manufacturing processes and semiconductor devices, and more particularly to methods of depositing silicon-germanium containing films used to form, or forming, semiconductor devices.

Description of the Related Art

Selective SiGe-epitaxial deposition permits the deposition of epitaxial layers on exposed silicon (Si) or other semiconductor regions of a substrate, also known as growth or growing of the layers, with no net SiGe growth on exposed dielectric areas of the substrate. Selective epitaxy can be used in the fabrication of semiconductor device structures, such as for forming desired layers in elevated source/drains, source/drain extensions, contact plugs, and base layers of bipolar devices. Generally, a selective epitaxy process involves two operations: a deposition operation and an etch operation. The deposition and etch operations occur simultaneously, with relatively different reaction rates, and thus deposition rates, on semiconductor and on dielectric surfaces. A selective process window for the deposition etch regime of selective SiGe growth results in cumulative deposition only on semiconductor surfaces, which can be tuned by changing the concentration of an etchant gas used to remove the deposited material from the exposed surfaces of the substrate.

Selective silicon germanium epitaxy by chemical vapor deposition typically employs precursors that contain one Si or Ge atoms, such as silane, dichlorosilane, or germane. The cumulative or net deposition of SiGe on Si or other semiconductor regions over dielectrics, known as selectivity to Si, is achieved by co-flowing an etchant such as hydrogen chloride along with the deposition precursor(s) used to deposit or grow the SiGe on exposed semiconductor on the substrate. During such processes, the temperature of the substrate is increased to, and/or maintained at, temperatures above 500° C. However, at substrate temperatures below 500° C., epitaxial growth of silicon germanium diminishes and deposition or growth selectivity for Si over dielectric materials drastically decreases.

Therefore, there is a need for a selective to Si silicon germanium epitaxy process that retains both good selectivity to Si and growth or deposition rate at low temperatures (<about 500° C.).

SUMMARY

In an embodiment, a method of depositing a silicon germanium material on a substrate is provided which includes positioning the substrate within a substrate processing chamber, the substrate having a dielectric material and a silicon containing single crystal thereon; maintaining the substrate at a temperature of about 450° C. or less; exposing the substrate to a process gas comprising: a silicon source gas, a germanium source gas, an etchant gas, a carrier gas, and at least one dopant source gas; and epitaxially and selectively depositing a first silicon germanium material on the substrate.

In another embodiment, a method of depositing a silicon germanium material on a substrate is provided which includes positioning the substrate within a substrate processing chamber, the substrate having a dielectric material and a silicon germanium single crystal thereon; maintaining the substrate at a temperature of about 450° C. or less; exposing the substrate to a process gas comprising: a silicon source gas, a germanium source gas, an etchant gas, a carrier gas, and at least one dopant source gas comprising a boron containing dopant source gas or a phosphorus containing dopant source gas; and epitaxially and selectively depositing a silicon germanium material on the substrate, the silicon germanium material having a resistivity of 0.3 mΩ·cm.

In another embodiment, a method of depositing a silicon germanium material on a substrate is provided which includes positioning the substrate within a substrate processing chamber, the substrate having a dielectric material and a silicon containing single crystal thereon; maintaining the substrate at a temperature of 400° C. or less; exposing the substrate to a process gas comprising: a silicon source gas, a germanium source gas comprising germane or digermane, an etchant gas comprising one or more of HCl, HF, $Cl_2$, HBr, $Br_2$, $SiCl_4$, $SiHCl_3$, $SiH_2Cl_2$, $GeCl_4$, and $GeHCl_3$, a carrier gas, and a dopant source gas comprising diborane; and epitaxially and selectively depositing a first silicon germanium material on the substrate.

In another embodiment, a non-transitory computer readable medium is provided that includes instructions that cause a computer system to control a substrate processing apparatus to perform a process, comprising: positioning the substrate within a substrate processing chamber, the substrate having a dielectric material and a silicon containing single crystal thereon; maintaining the substrate at a temperature of about 450° C. or less; exposing the substrate to a process gas comprising: a silicon source gas, a germanium source gas, an etchant gas, a carrier gas, and at least one dopant source gas; and epitaxially and selectively depositing a first silicon germanium material on the substrate.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1A:
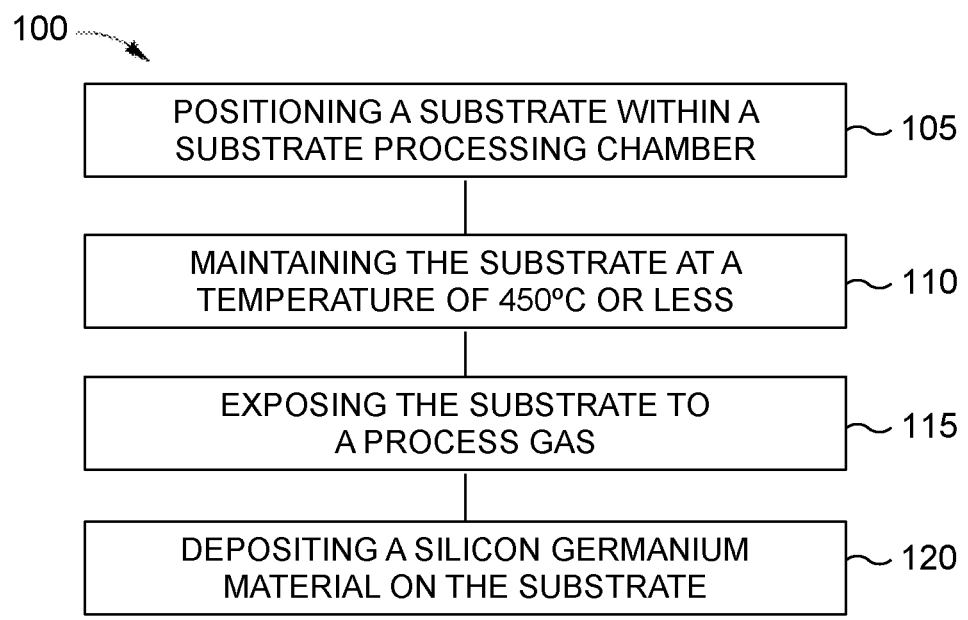
FIG. 1A is a flow chart illustrating a method of forming an epitaxial layer according to some embodiments.

Embodiments described herein illustrate a process to epitaxially deposit silicon containing compounds during the manufacture of various device structures. The processes described herein allow for selective and epitaxial growth or deposition of a silicon germanium film layer on exposed crystalline silicon containing regions of a substrate and not on exposed dielectric regions of the substrate, at low substrate temperatures (e.g., about 450° C. or less), with almost complete selectivity for the exposed crystalline silicon over the exposed dielectric of the substrate, when performed at temperatures of about 400° C., such as about 350° C. or less. The processes herein advantageously provide boron concentrations in the grown or deposited silicon containing compound of about $1\times10^{15}$ or greater, such as about $1\times10^{21}$ or greater, such as about $5\times10^{21}$. Moreover, the dopant, such as boron, advantageously allows growth or deposition of epitaxial silicon germanium materials at low temperatures. The lower temperature processes advantageously enable lower thermal budgets for the process and thereby reduce negative thermal effects on the devices being formed.

Embodiments of the present disclosure include processes to selectively grow or deposit films of epitaxial silicon-containing compounds. For example, the silicon-containing compounds grow on exposed regions of crystalline silicon containing regions of a substrate, and not on exposed regions of dielectric materials on the substrate. Selective silicon containing film growth or deposition may be performed when the substrate surface has exposed thereat more than one material, such as exposed single crystalline silicon surface areas, and features that are covered with dielectric materials such as with SiO and SiN layers. Epitaxial growth or deposition selective to the crystalline silicon surface, while leaving the dielectric features or structures uncoated by the epitaxial deposition material, is achieved using an etchant (e.g., HCl) during deposition. During deposition, the deposition material forms a crystalline layer on the exposed single crystal silicon, and a polycrystalline or amorphous layer on the exposed dielectric surfaces. The etchant removes the amorphous or polycrystalline film grown or deposited on the amorphous or polycrystalline features faster than it can remove the epitaxial crystalline film grown or deposited on the exposed crystalline material of the substrate (or the silicon germanium material never grows on the surface of the dielectric material of the substrate), and thus selective epitaxial net growth or deposition of the silicon containing compound on the exposed crystalline material of the substrate is achieved.

Processes disclosed herein may be performed on various substrates such as semiconductor wafers, such as crystalline and single crystalline silicon (e.g., Si<100> and Si<111>), silicon germanium, doped or undoped silicon or germanium substrates, silicon on insulator (SOI) substrates, III-V group materials, and patterned or non-patterned substrates, having a variety of geometries (e.g., round, square and rectangular) and sizes (e.g., 200 mm OD, 300 mm OD, 400 mm OD). Surfaces and/or substrates include these materials, as well as films, layers and materials with dielectric, conductive and barrier properties and include polysilicon.

As used herein, silicon compounds and silicon-containing compounds refer to materials, layers, and/or films and include Si, SiGe, doped variants thereof, and combinations thereof which are selectively and epitaxially grown during the processes described herein. The silicon compounds and silicon-containing compounds include strained, unstrained, or strained and unstrained layers within the films.

FIG. 1A is a flow chart illustrating a method 100 of forming a selective epitaxial layer on selected surfaces of a substrate according to an embodiment. The epitaxial layer is, for example, a silicon germanium film. The method 100 includes positioning a substrate within a substrate processing chamber at operation 105. The method 100 further includes heating the substrate to, maintaining the substrate at, or heating the substrate to and maintaining it at a temperature of 450° C. or less, such as 400° C. or less, such as 350° C. or less, or such as 300° C. or less at operation 110. For example the substrate may be maintained at a temperature between about 250° C. and about 450° C., or such as between about 270° C. and about 450° C. during the deposition or growth of the Si containing compound. The method 100 further includes exposing the heated substrate to a process gas comprising a silicon source gas, a germanium source gas, an etchant, a carrier gas, and at least one dopant source gas at operation 115. The method 100 further includes epitaxially and selectively growing or depositing a silicon germanium material on the crystalline silicon surface while the dielectric features or structures remain uncoated by the silicon germanium material at the end of operation 120.

Carrier gases are used to transport the silicon source gas(es), germanium source gas(es), dopant source gas(es), and etchant sources gas(es) during the processes described herein. Carrier gases include $H_2$, Ar, $N_2$, He, and combinations thereof. In some embodiments, $H_2$ is used as a carrier gas. In other embodiments, $N_2$ is used as a carrier gas. Carrier gases may be combined in various ratios during some embodiments of the process.

Etchants in gas form are employed to remove Si containing material film grown on the exposed dielectric materials which may form on the exposed dielectric materials of the substrate in an amorphous or polycrystalline form faster than it can remove the Si containing material grown or deposited on the exposed crystalline silicon in crystalline form, for example on a single crystal silicon material, of the substrate. Etchants useful for such purposes during processes described herein include HCl, HF, HBr, $Br_2$, $Si_2Cl_6$, $SiCl_4$, $SiHCl_3$, $SiH_2Cl_2$, $CCl_4$, $Cl_2$, $GeCl_4$, $GeHCl_3$, and combinations thereof.

Silicon source gas(es) or precursors that are useful for the selective epitaxy processes described herein include silane ($SiH_4$), higher order silanes, halogenated silanes, and organosilanes. Higher order silanes include compounds with an empirical formula $Si_xH_{(2x+2)}$, such as disilane ($Si_2H_6$), trisilane ($Si_3H_8$), and tetrasilane ($Si_4H_{10}$). Halogenated silanes include compounds with the empirical formula $X'_ySi_xH_{(2x+2-y)}$, where $X'=F$, Cl, Br or I, such as dichlorosilane ($SiH_2Cl_2$), tetrachlorosilane ($SiCl_4$), and hexachlorodisilane ($Si_2Cl_6$), and trichlorosilane ($SiHCl_3$). Organosilanes include compounds with an empirical formula $R_ySi_xH_{(2x+2-y)}$, where R=methyl, ethyl, propyl or butyl, such as methylsilane (($CH_3$)$SiH_3$), dimethylsilane (($CH_3$)$_2SiH_2$), ethylsilane (($CH_3CH_2$)$SiH_3$), methyldisilane (($CH_3$)$Si_2H_5$), dimethyldisilane (($CH_3$)$_2Si_2H_4$) and hexamethyldisilane (($CH_3$)$_6Si_2$).

Germanium source gas(es) or precursors that are useful for the selective epitaxy processes described herein include germanes (e.g., $GeH_4$), higher order germanes, halogenated germanes, and organogermanes. Higher order germanes include compounds with an empirical formula $Ge_xH_{(2x+2)}$, such as digermane ($Ge_2H_6$), trigermane ($Ge_3H_8$), and tetragermane ($Ge_4H_{10}$). Halogenated germanes include $GeCl_4$ (germanium tetrachloride) and $GeHCl_3$ (trichlorogermane). Organogermanes include compounds with an empirical formula $R_yGe_xH_{(2x+2-y)}$, where R=methyl, ethyl, propyl or butyl, such as methylgermane (($CH_3$)$GeH_3$), dimethylgermane (($CH_3$)$_2GeH_2$), ethylgermane (($CH_3CH_2$)$GeH_3$), methyldigermane (($CH_3$)$Ge_2H_5$), dimethyldigermane (($CH_3$)$_2Ge_2H_4$) and hexamethyldigermane (($CH_3$)$_6Ge_2$).

The deposited film layers of the silicon-containing compounds are doped with particular dopants to achieve the desired conductive characteristics thereof. In some embodiments, the silicon-containing compound is doped p-type, such as by flowing diborane into the deposition chamber at a requisite ratio to the deposition precursor gas to add boron at a concentration of about $1 \times 10^{15}$ atoms/cm$^3$ or more, such as about $1 \times 10^{19}$ atoms/cm$^3$ or more, such as at about $5 \times 10^{21}$ atoms/cm$^3$ into the deposited film layer. For example the silicon-containing compound is doped p-type, such as by flowing diborane during the deposition of the silicon containing compound to add boron therein at a concentration in the range of from about $1 \times 10^{15}$ atoms/cm$^3$ to about $5 \times 10^{21}$ atoms/cm$^3$ (such as from about $5 \times 10^{19}$ atoms/cm$^3$ to about $5 \times 10^{21}$ atoms/cm$^3$, or from about $1 \times 10^{18}$ atoms/cm$^3$ to about $5 \times 10^{21}$ atoms/cm$^3$, or in the range from about $1 \times 10^{20}$ atoms/cm$^3$ to about $2.5 \times 10^{21}$ atoms/cm$^3$). In another embodiment, the silicon-containing compound is doped n-type, by flowing a phosphorus source gas into the deposition chamber to achieve a P concentration in the deposited film layer of $1 \times 10^{15}$ atoms/cm$^3$ to about $5 \times 10^{21}$ atoms/cm$^3$ (such as from about $5 \times 10^{19}$ atoms/cm$^3$ to about $5 \times 10^{21}$ atoms/cm$^3$, or from about $1 \times 10^{18}$ atoms/cm$^3$ to about $5 \times 10^{21}$ atoms/cm$^3$, or in the range from about $1 \times 10^{20}$ atoms/cm$^3$ to about $2.5 \times 10^{21}$ atoms/cm$^3$).

Dopants used herein include boron containing dopants and phosphorus containing dopants. Boron containing dopant source gases include boranes, organoboranes (e.g., alkylboranes), and boron halides. Boranes include borane ($BH_3$), diborane ($B_2H_6$), triborane ($B_3H_5$), tetraborane ($B_4H_{10}$), pentaborane(9) ($B_5H_9$), pentaborane(11), hexaborane(10) ($B_6H_{10}$), hexaborane(12) ($B_6H_{12}$), and decaborane(14) (($B_{10}H_{14}$), while alkylboranes include compounds with an empirical formula $R_xBH_{(3-x)}$, where R=methyl, ethyl, propyl or butyl and x=0, 1, 2 or 3. Alkylboranes include trimethylborane (($CH_3$)$_3B$), dimethylborane (($CH_3$)$_2BH$), triethylborane (($CH_3CH_2$)$_3B$) and diethylborane (($CH_3CH_2$)$_2BH$). Boron halides include electron deficient boron halides such as boron trifluoride ($BF_3$), boron trichloride ($BCl_3$), and boron tribromide ($BBr_3$), Dopant source gases also include phosphorus containing dopants such as phosphine ($PH_3$) and alkylphosphines, such as compounds with an empirical formula $R_xPH_{(3-x)}$, where R=methyl, ethyl, propyl or butyl and x=0, 1, 2 or 3. Alkylphosphines include trimethylphosphine (($CH_3$)$_3P$), dimethylphosphine (($CH_3$)$_2PH$), triethylphosphine (($CH_3CH_2$)$_3P$), and diethylphosphine (($CH_3CH_2$)$_2PH$). Other phosphorus containing compounds that can be used as dopant source gases include phosphorus trichloride ($PCl_3$), phosphorus tribromide ($PBr_3$), phosphanes such as tributyl phosphate (TBP), and silylphosphines [($H_3Si$)$_{3-x}PR_x$] where x=0, 1, 2, and $R_x$ is hydrogen or deuterium. Dopant source gases also include arsenic containing dopants including halogenated arsenic compounds arsine ($AsH_3$), trimethylarsenic, and silylarsines [($H_3Si$)$_{3-x}AsR_x$] where x=0, 1, 2, and $R_x$ is hydrogen or deuterium.

As an example of method 100, a silicon containing material is epitaxially and selectively grown to form a doped SiGe material on the exposed monocrystalline silicon surface of a substrate, but not on the exposed dielectric materials of the substrate. For example, the doped SiGe material forms selectively on the elevated source/drains, source/drain extensions, contact plugs, and base layers of bipolar devices which comprise monocrystalline silicon. The monocrystalline surface can be, for example, a silicon containing single crystal or a silicon germanium single crystal. A substrate (e.g., 300 mm OD) containing a semiconductor feature is placed into the substrate processing chamber. During processing, a silicon source gas (e.g., silane) is flowed concurrently into the substrate processing chamber with a carrier gas (e.g., $H_2$ and/or $N_2$), a germanium source gas (e.g., $GeH_4$), a dopant source gas (e.g., $B_2H_6$) and an etchant (e.g., HCl). These gases can be flowed into the substrate processing chamber in same or different conduits. The gases can be mixed in a showerhead, an introduction channel to the chamber, in the chamber, or after exiting a zoned showerhead. The flow rate of the silicon source gas is in the range of from about 5 sccm to about 500 sccm, such as from about 10 sccm to about 100 sccm, such as from about 20 sccm to about 50 sccm. The flow rate of the carrier gas is from about 1,000 sccm to about 60,000 sccm, such as from about 10,000 sccm to about 20,000 sccm, such as from about 12,000 sccm to about 15,000 sccm. The flow rate of the germanium source gas is in the range of from about 0.1 sccm to about 100 sccm, such as from about 0.1 sccm to about 10 sccm or from about 0.5 sccm to about 20 sccm, such as from about 0.5 sccm to about 2 sccm, for example about 1 sccm. The flow rate of the dopant source gas is from about 0.01 sccm to about 3 sccm, such as from about 0.1 sccm to about 2 sccm, for example about 0.5 sccm to about 1 sccm. The flow rate of the etchant gas is in the range of from about 5 sccm to about 1,000 sccm, such as from about 10 sccm to about 50 sccm, for example about 20 sccm to about 40 sccm. The substrate processing chamber is maintained at a pressure of from about 0.1 Torr to about 200 Torr, such as from about 5 Torr to about 20 Torr, for example from about from about 10 Torr to about 15 Torr. The substrate is maintained at a temperature of about 450° C. or less, such as about 400° C. or less, such as about 350° C. or less, such as about 300° C. or less. For example the substrate may be maintained at (or heated to and maintained at) a temperature between about 250° C. and about 450° C., such as between about 270° C. and about 450° C. The reaction of the source gas mixture is thermally driven, and it reacts at the heated substrate surface to epitaxially deposit a silicon material, namely a silicon germanium material on the crystalline silicon surface of the substrate and it is believed on the amorphous or polycrystalline silicon based dielectric features of the substrate. The etchant (e.g., HCl) etches off the SiGe compounds which also form on the amorphous or polycrystalline silicon based or other dielectric features on the surface of the substrate, but does not significantly etch the epitaxial layer formed on the monocrystalline silicon.

The deposition or growth process is thus performed to selectively form a doped SiGe material on the exposed crystalline silicon surface having a thickness in a range from about 20 Å to about 3,000 Å (such as from about 50 Å to about 1000 Å, for example from about 50 Å to about 100 Å) at a deposition rate of between about 5 Å/min and about 600 Å/min (such as from about 5 Å/min to about 50 Å/min, for example from about 10 Å/min to about 30 Å/min). The germanium concentration of the deposited SiGe material is in the range from about 1 atomic percent to about 100 atomic percent material (such as from about 10 atomic percent to about 100 atomic percent, such as from about 10 atomic percent to about 90 atomic percent, such as from about 40 atomic percent to about 70 atomic percent, for example about 60 atomic percent). The boron concentration of the deposited SiGe material is in the range of from about $1 \times 10^{15}$ atoms/cm$^3$ to about $5 \times 10^{21}$ atoms/cm$^3$ (such as from about $5 \times 10^{19}$ atoms/cm$^3$ to about $5 \times 10^{21}$ atoms/cm$^3$, or from about $1 \times 10^{18}$ atoms/cm$^3$ to about $5 \times 10^{21}$ atoms/cm$^3$, or in the range from about $1 \times 10^{20}$ atoms/cm$^3$ to about $2.5 \times 10^{21}$ atoms/cm$^3$).

The resistivity of the epitaxially grown B-doped SiGe layer is about 0.3 mΩ·cm or less (such as between about 0.2 mΩ·cm and about 0.3 mΩ·cm, for example, about 0.25 mΩ·cm or less).

Figure 1B:
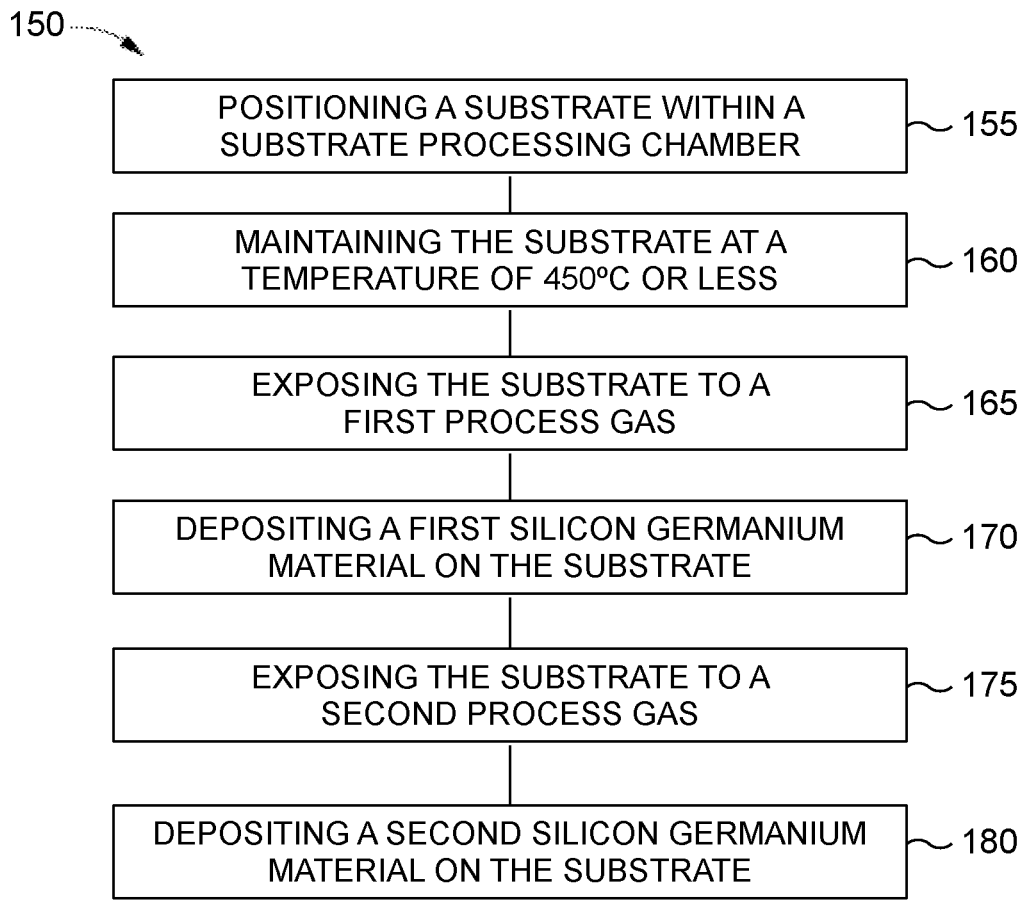
FIG. 1B is a flow chart illustrating a method of forming an epitaxial layer according to some embodiments.

FIG. 1B is a flow chart illustrating a method 150 of selectively forming an epitaxial layer on portions of a substrate according to an embodiment. The epitaxial layer is, for example, a silicon germanium film. The method 150 includes positioning a substrate within a substrate processing chamber at operation 155. The method 150 further includes maintaining (and/or heating) the substrate at a temperature of 450° C. or less, such as 400° C. or less, such as 350° C. or less, such as 300° C. or less at operation 160. For example the substrate may be maintained (or heated) at a temperature between about 250° C. and about 450° C., such as between about 270° C. and about 450° C. The method 150 further includes exposing the substrate to a first process gas comprising: a first silicon source gas, a first germanium source gas, an a first etchant gas, a first carrier gas, and at least one first dopant source gas at operation 165. The method 150 further includes epitaxially and selectively depositing a first silicon germanium material on portions of the substrate at operation 170. Operations 155, 160, 165, and 170 are the same as operations 105, 110, 115, and 120 of method 100. The method 150 further includes exposing the substrate to a second process gas comprising: a second silicon source gas, a second germanium source gas, a second etchant gas, and a second carrier gas, and optionally a second dopant source gas at operation 175. The method 150 further includes epitaxially and selectively depositing a second silicon germanium material on portions of the substrate at operation 180.

As an example of method 150, at operations 175 and 180 a second silicon compound is epitaxially grown as a SiGe material using a second silicon source gas (e.g., dichlorosilane, Cl$_2$SiH$_2$) subsequent to depositing any of the silicon compounds as described above. A first silicon germanium material is deposited or grown by, e.g., the example of method 100 described above. A second silicon source gas (e.g., dichlorosilane) is flowed concurrently into the substrate processing chamber with a second carrier gas (e.g., H$_2$ and/or N$_2$), a second germanium source gas (e.g., GeH$_4$), a second dopant source gas (e.g., B$_2$H$_6$) and a second etchant gas (e.g., HCl). The flow rate of dichlorosilane is in the range of from about 5 sccm to about 500 sccm, such as from about 10 sccm to about 100 sccm, such as from about 20 sccm to about 50 sccm. The flow rate of the second carrier gas is from about 1,000 sccm to about 60,000 sccm, such as from about 10,000 sccm to about 20,000 sccm, such as from about 12,000 sccm to about 15,000 sccm. The flow rate of the second germanium source gas is in the range of from about 0.1 sccm to about 100 sccm, such as from about 0.1 sccm to about 10 sccm or from about 0.5 sccm to about 20 sccm, such as from about 0.5 sccm to about 2 sccm, for example about 1 sccm. The flow rate of the second dopant source gas is from about 0.01 sccm to about 3 sccm, such as from about 0.1 sccm to about 2 sccm, for example about 0.5 sccm to about 1 sccm. The flow rate of the second etchant gas is in the range of from about 5 sccm to about 1,000 sccm, such as from about 10 sccm to about 50 sccm, for example about 20 sccm to about 40 sccm. The substrate processing chamber is maintained at a pressure of from about 0.1 Torr to about 200 Torr, such as from about 5 Torr to about 20 Torr, for example from about from about 10 Torr to about 15 Torr. The substrate is maintained at a temperature of about 450° C. or less, such as about 400° C. or less, such as about 350° C. or less, such as about 300° C. or less. For example the substrate may be maintained at (or heated to and maintained at) a temperature between about 250° C. and about 450° C., such as between about 270° C. and about 450° C. The reaction of the second source gas mixture is thermally driven, and it reacts at the heated substrate surface to epitaxially deposit a second silicon material, namely a second silicon germanium material, on the first SiGe material of the substrate and the dielectric features of the substrate. The second etchant etches the SiGe compounds from the amorphous or polycrystalline dielectric features on the surface of the substrate, but does not significantly etch the epitaxial layer formed on the surface of the first SiGe material.

The process is performed to selectively form a second SiGe material on the surface of the first SiGe material with a thickness in a range from about 20 Å to about 3,000 Å (such as from about 50 Å to about 1000 Å, for example from about 50 Å to about 100 Å) at a deposition rate of between about 5 Å/min and about 600 Å/min (such as from about 5 Å/min to about 50 Å/min, for example from about 10 Å/min to about 30 Å/min). The germanium concentration of the deposited SiGe material is in the range from about 1 atomic percent to about 100 atomic percent material (such as from about 10 atomic percent to about 100 atomic percent, such as from about 10 atomic percent to about 90 atomic percent, such as from about 40 atomic percent to about 70 atomic percent, for example about 60 atomic percent). In another embodiment, a third silicon containing layer is deposited using any of the processes discussed above.

In some embodiments, the substrate surface is exposed to ambient conditions, such as air which includes oxygen and/or water vapor therein, between process operations. The ambient exposure generally occurs while moving substrates between multiple process chambers during the fabrication of devices. A first silicon-containing layer is deposited onto the substrate surface, the substrate is exposed to ambient conditions, and subsequently, a second silicon-containing layer is deposited onto the substrate surface. In one aspect, a cap layer is deposited on the first silicon-containing layer before the exposure of the layer to the ambient conditions. The cap layer may be semiconductor material, such as silicon. For example, a silicon-germanium layer is deposited on the substrate surface, a silicon cap layer is deposited on the just grown or deposited silicon-germanium layer, the substrate is exposed to ambient conditions, and subsequently a second-silicon containing layer is deposited on the silicon cap layer. The Si cap layer may be placed on top of a B-doped SiGe layer to protect the B-doped SiGe layer from oxidation. The Si cap surface can be removed by oxidation thereof to form a silicon oxide, followed by selective etching of it, if it needs to be removed before the next epi layer is selectively formed.

In some embodiments, the silicon containing material includes a germanium concentration within the range from about 0 atomic percent to about 95 atomic percent. In other embodiments, a germanium concentration is within the range from about 1 atomic percent to about 30 atomic percent, such as from about 10 atomic percent to about 25 atomic percent, such as at about 20 atomic percent.

In some embodiments, ratios of the silicon source gas and the germanium source gas can be varied in order to provide control of the elemental concentrations of the silicon, germanium, and dopant while growing graded films.

The processes described herein are useful while depositing silicon-containing compound layers in, for example, FinFETs, traditional planar MOSFETs, and bipolar transistors.

Figure 2:
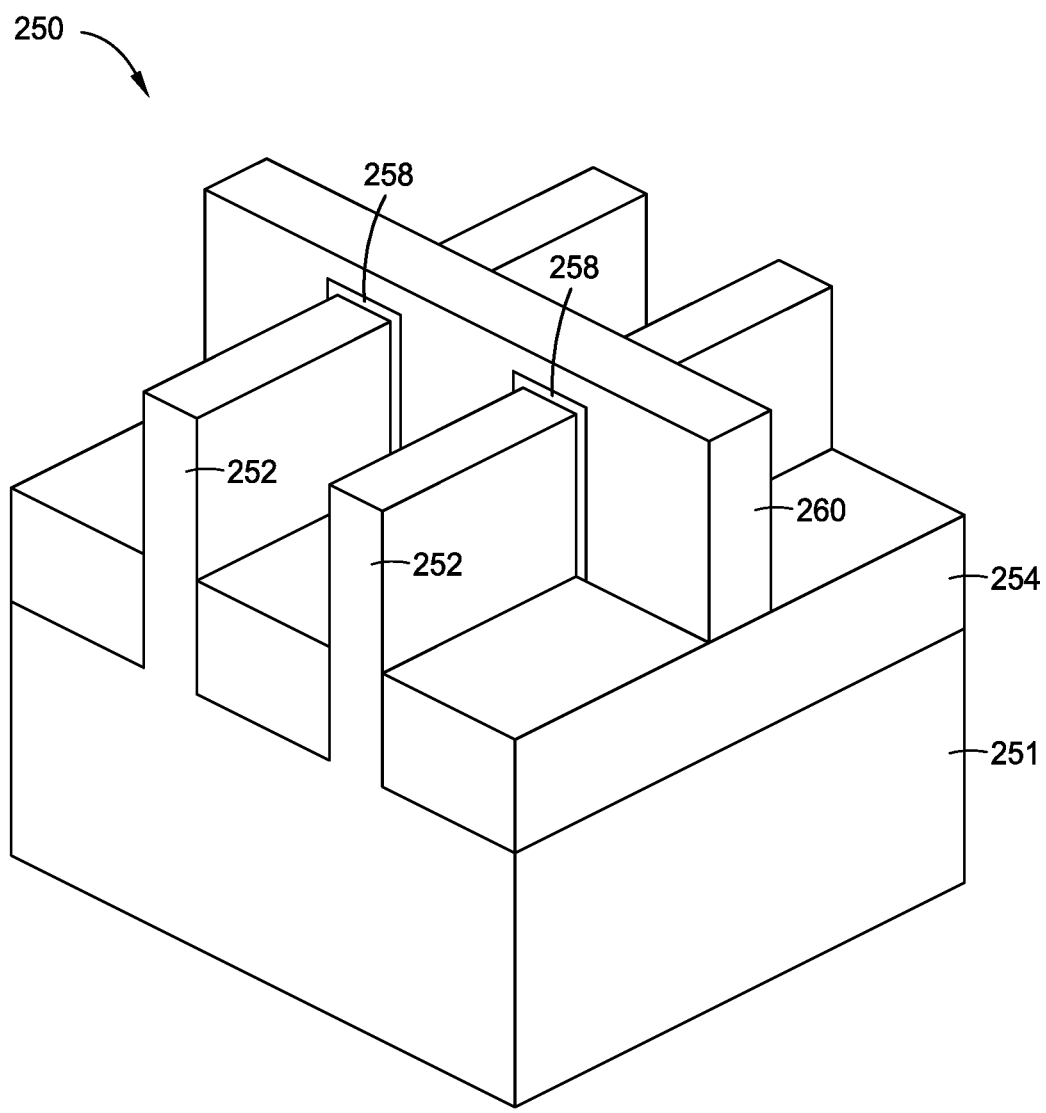
FIG. 2 shows a fin field effect transistor (FinFET) device with an epitaxially deposited silicon-containing layer according to some embodiments.

FIG. 2 shows a perspective view of a FinFET semiconductor structure 250, the features of which may be epitaxially grown with the silicon containing compound according to one of the embodiments described herein. The semiconductor structure 250 may include a substrate 251, a plurality of fins 252 (only two are shown, but the structure may have more than two fins), a dielectric material 254 disposed between adjacent fins 252 on the substrate 251, and a gate electrode 260 disposed on the dielectric material 254 and over a portion of each fin 252. The substrate 251 may be a bulk silicon substrate, and may be doped with a p-type or an n-type impurity. The plurality of fins 252 may be fabricated from the same material as the substrate 251. The dielectric material 254 may form isolation regions, such as shallow trench isolation (STI) regions, and may be fabricated from silicon oxide, silicon nitride, silicon oxynitride, silicon carbonitride, or any other suitable dielectric material. As shown in FIG. 2, each of the plurality of fins 252 extends a distance above the upper surface of the dielectric material 254. A gate dielectric 258 is formed between the gate electrode 260 and the plurality of fins 252. The gate dielectric 258 facilitates electrical isolation between the gate electrode 260 and the plurality of fins 252. The gate dielectric 258 may be fabricated from silicon nitride, silicon oxide, hafnium oxide, hafnium silicon oxynitride, hafnium silicate, hafnium silicon oxide, or any other suitable gate dielectric material. The gate electrode 260 may be fabricated from polysilicon, amorphous silicon, germanium, silicon germanium, metals, or metal alloys.

Figure 3A:
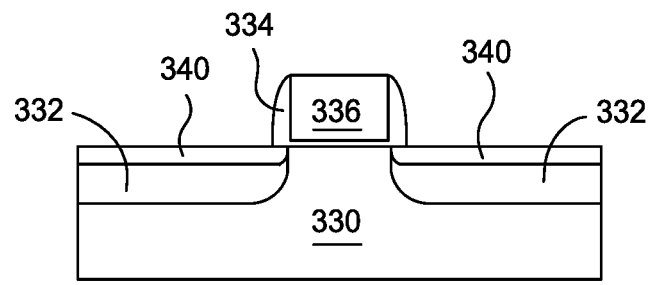
FIG. 3A shows an illustration of a source/drain extension device within a traditional metal-oxide-semiconductor field effect transistor (MOSFET).

FIG. 3A depicts the cross section for a traditional planar MOSFET according to some embodiments. After forming the spacer 334 on both sides of the dummy gate 336, a portion of the substrate or of the fin is etched away followed by wet-cleaning of the substrate, to produce a recess 332 within which the silicon-containing compound is deposited epitaxially according to the processes described herein and for use as the source/drain. The silicon-containing compound epitaxially grows to mimic the crystal lattice of the exposed substrate or fin surface and maintains this arrangement as the silicon-containing compound grows with thickness. Subsequent to this source drain formation, and after several intermediate steps, the dummy gate 336 is eventually replaced with the actual metal gate electrode.

The epitaxial silicon compound layer 332 is selectively deposited within the source/drain region according to embodiments described herein. Selective silicon containing film growth may be performed when the substrate surface 330 has exposed thereat more than one material, such as exposed single crystalline silicon surface areas, and features that are covered with dielectric materials such as with SiO and SiN layers. The silicon compound layer 332 is composed of, for example, doped SiGe containing layers located to either side of the gate in the device depicted by FIG. 3 and having a germanium concentration of, for example, about 1 atomic percent to about 30 atomic percent, such as at about 20 atomic percent, and a dopant (e.g., B or P) concentration of, for example, $1 \times 10^{15}$ atoms/cm$^3$ to about $5 \times 10^{21}$ atoms/cm$^3$ (such as from about $5 \times 10^{19}$ atoms/cm$^3$ to about $5 \times 10^{21}$ atoms/cm$^3$, or from about $1 \times 10^{18}$ atoms/cm$^3$ to about $5 \times 10^{21}$ atoms/cm$^3$, or in the range from about $1 \times 10^{20}$ atoms/cm$^3$ to about $2.5 \times 10^{21}$ atoms/cm$^3$.

In some embodiments, B-doped SiGe layer 340 can, using the processes described herein, be formed on top of an existing B-doped SiGe source/drain 332 at a low temperature on the order of below about 450° C., to form a contact layer. This contact layer reduces the Schottky barrier between B-doped SiGe source/drain and the metal electrode, and provides lower contact resistivity. In this embodiment, the existing B-doped SiGe source/drain can be made by the same processes described herein, or by other methods, such as higher-temperature epitaxy (e.g., temperatures greater than about 500° C., such as between about 600° C. and about 700° C.).

Figure 3B:
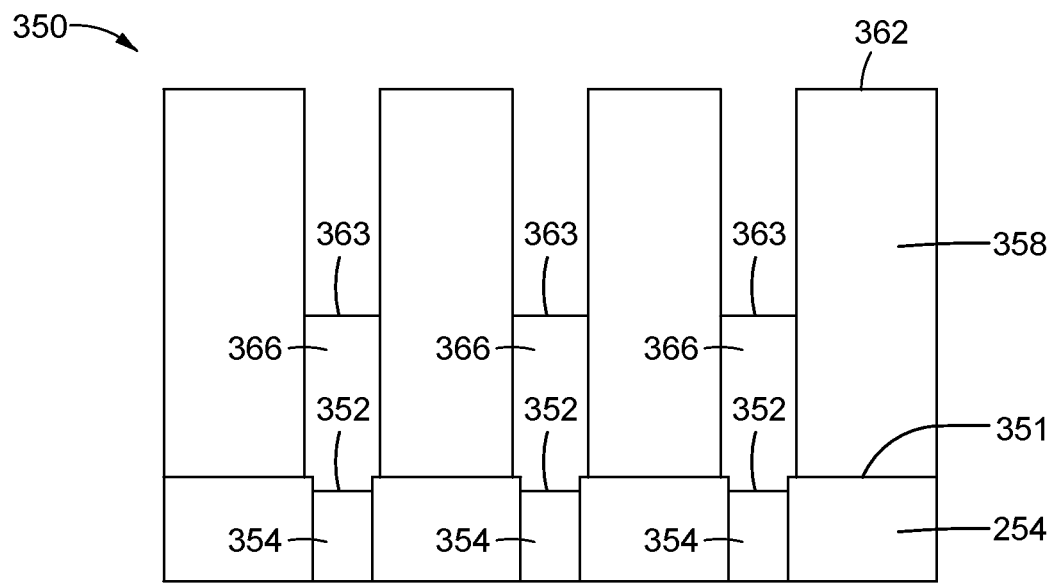
FIG. 3B shows an illustration of a source/drain extension device within a FinFET.

FIG. 3B depicts the cross section for a FinFET 350 according to some embodiments. An epitaxial silicon compound layer 366 is deposited on the surface 352 of each fin 354 and extending over an upper surface 351 of the dielectric material 254 (the dielectric material 254 is also shown in FIG. 2). The silicon compound layer 366 may be also deposited on the surface 362 of the dielectric material 358, and an etch back process may be performed to remove the silicon compound layer 366 deposited on the surface 362 of the dielectric material 358. The silicon compound layer 366 may be the source or drain of a FinFET device and may be a silicon and/or germanium based material. The silicon compound layer 366 may be formed by an epitaxial deposition process described herein in an epitaxial deposition chamber available from Applied Materials, Inc. In one embodiment, the silicon compound layer 366 is silicon doped with phosphorus and the FinFET device is an n-type FET. In another embodiment, the silicon compound layer 366 is silicon germanium doped with boron or gallium, and the FinFET device is a p-type FET. Each silicon compound layer 366 has a surface 363 that is recessed from the surface 362 of the dielectric material 358.

The epitaxial silicon compound layer 366 is selectively deposited within the source/drain region according to embodiments described herein. Selective silicon containing film growth may be performed when the substrate surface has exposed thereat more than one material, such as exposed single crystalline silicon surface areas, and features that are covered with dielectric materials such as with SiO and SiN layers. The silicon compound layer 366 is composed of, for example, doped SiGe containing layers located to either side of the gate in the device depicted by FIG. 3B and having a germanium concentration of, for example, about 1 atomic percent to about 30 atomic percent, such as at about 20 atomic percent, and a dopant (e.g., B or P) concentration of, for example, $1 \times 10^{15}$ atoms/cm$^3$ to about $5 \times 10^{21}$ atoms/cm$^3$ (such as from about $5 \times 10^{19}$ atoms/cm$^3$ to about $5 \times 10^{21}$ atoms/cm$^3$, or from about $1 \times 10^{18}$ atoms/cm$^3$ to about $5 \times 10^{21}$ atoms/cm$^3$, or in the range from about $1 \times 10^{20}$ atoms/cm$^3$ to about $2.5 \times 10^{21}$ atoms/cm$^3$.

Although not shown, further operations may be performed on the substrate. For example, a metal layer can be deposited over the features of the substrate (e.g., a silicon containing single crystal surface, such as the source and drain regions of the substrate) and the substrate and layers formed thereon is thereafter annealed. The metal layer includes cobalt, nickel or titanium, among other metals. During the annealing process, the silicon compound layer is converted to metal silicide layers. For example, when a metal (e.g., cobalt) is deposited as the metal layer, the resulting metal silicide layer is cobalt silicide.

The processes described herein can be used to deposit silicon compound films used for Bipolar (e.g., base, emitter, collector, emitter contact), BiCMOS (e.g., base, emitter, collector, emitter contact) and traditional planar or FinFET CMOS (e.g., channel, source/drain, source/drain extension, elevated source/drain, substrate, strained silicon, silicon on insulator and contact plug). Other embodiments of processes teach the growth of silicon films that can be used as gate, base contact, collector contact, emitter contact, elevated sources/drains, and other uses. Other devices include field effect transistors (FET).

In processes of the present disclosure, silicon containing compounds (e.g., films, layers, and materials) are grown or deposited by chemical vapor deposition (CVD) processes, wherein CVD processes include atomic layer deposition (ALD) processes and/or atomic layer epitaxy (ALE) processes. Chemical vapor deposition includes the use of many techniques, such as plasma-assisted CVD (PA-CVD), atomic layer CVD (ALCVD), organometallic or metalorganic CVD (OMCVD or MOCVD), laser-assisted CVD (LA-CVD), ultraviolet CVD (UV-CVD), hot-wire CVD (HWCVD), reduced-pressure CVD (RP-CVD), and ultra-high vacuum CVD (UHV-CVD). The processes of the present disclosure can be carried out in equipment known in the art of ALE, CVD and ALD processing. The apparatus brings the source gas(es) into contact with a substrate on which the silicon-containing compounds are grown. An exemplary epitaxy chamber that may be used to grow the silicon containing compounds described herein is a Centura® RP EPI chamber available from Applied Materials, Inc., of Santa Clara, Calif. One exemplary epitaxy chamber is shown in FIG. 4, and described below.

Figure 4:
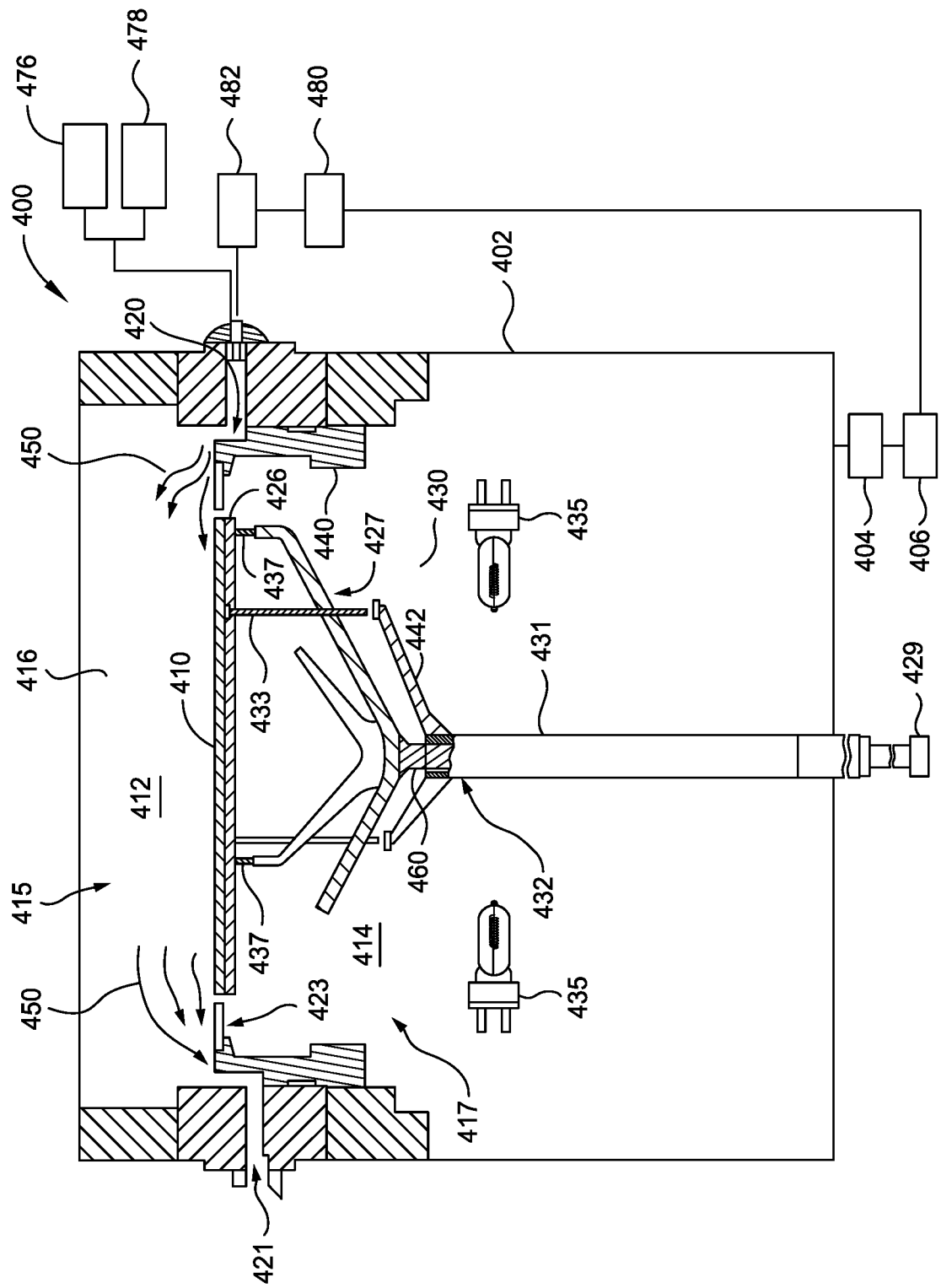
FIG. 4 is a cross-sectional view of a thermal processing chamber that may be used to perform epitaxial processes.

FIG. 4 is a cross-sectional view of a thermal processing chamber 400 that may be used to perform the epitaxial processes described herein. The processing chamber 400 includes a chamber body 402, support systems 404, and a controller 406. The chamber body 402 includes an upper portion 412 and a lower portion 414. The upper portion 412 includes the area within the chamber body 402 between the upper dome 416 and a substrate 410. The lower portion 414 includes the area within the chamber body 402 between a lower dome 430 and the bottom of the substrate 410. Deposition processes generally occur on the upper surface of the substrate 410 exposed to and within the upper portion 412.

The support system 404 includes components used to execute and monitor pre-determined processes, such as the growth or deposition of thin films in the processing chamber 400 as described herein. The controller 406 is coupled to the support system 404 and is adapted to control the processing chamber 400 and support system 404. The controller 406 includes a central processing unit (CPU), a memory, and support circuits.

The processing chamber 400 includes a plurality of heat sources, such as lamps 435, which are adapted to provide thermal energy to components positioned within the substrate processing chamber 400. For example, the lamps 435 may be adapted to provide thermal energy to the substrate 410, a susceptor 426 for supporting a substrate in the processing chamber 400, and/or a preheat ring 423. The lower dome 430 may be formed from an optically transparent material, such as quartz, to facilitate the passage of thermal radiation therethrough. It is contemplated that lamps 435 may be positioned to provide thermal energy through the upper dome 416 as well as through the lower dome 430.

The chamber body 402 includes a plurality of plenums formed therein. The plenums are in fluid communication with one or more gas sources 476, such as a carrier gas, and one or more precursor sources 478, such as process gases (e.g., deposition gases and dopant source gases). For example, a first plenum 420 may be adapted to provide a deposition gas 450 therethrough into the upper portion 412 of the chamber body 402, while a second plenum 421 may be adapted to exhaust the deposition gas 450 from the upper portion 412. In such a manner, the deposition gas 450 may flow parallel to an upper surface of the substrate 410.

In cases where a liquid precursor (e.g., tetrasilane) is used, the thermal processing chamber 400 may include a liquid vaporizer 482 in fluid communication with a liquid precursor source 480. The liquid vaporizer 482 is be used for vaporizing liquid precursors to be delivered to the thermal processing chamber 400. While not shown, it is contemplated that the liquid precursor source 480 may include, for example, one or more ampoules of precursor liquid and solvent liquid, a shut-off valve, and a liquid flow meter (LFM). As an alternative to the liquid vaporizer, a bubbler may be used to deliver the liquid precursor(s) to the chamber. In such cases, an ampoule of liquid precursor is connected to the process volume of the chamber through a bubbler.

A substrate support assembly 432 is positioned in the lower portion 414 of the chamber body 402. The substrate support assembly 432 is illustrated supporting a substrate 410 in a processing position. The substrate support assembly 432 includes a susceptor support 427 formed from an optically transparent material and the susceptor 426 supported by the susceptor support 427. Support pins 437 couple the susceptor support 427 to the susceptor 426. A shaft 460 of the susceptor support 427 is positioned within a shroud 431 to which lift pin contacts 442 are coupled. The susceptor support 427 is rotatable in order to facilitate the rotation of the substrate 410 about its center during processing. Rotation of the susceptor support 427 is facilitated by a motor, or a belt and motor (not shown). An actuator 429 is coupled to the susceptor support 427 and is used to lift and retract the shaft in order to raise and lower the support. The shroud 431 is generally fixed in position, and therefore, does not rotate during processing.

Lift pins 433 are disposed through openings (not labeled) formed in the susceptor support 427. The lift pins 433 are vertically actuatable by contact with moveable lift pin contacts 442 and are adapted to contact the underside of the substrate 410 to lift the substrate 410 from a processing position (as shown) to a substrate removal position, and to support a newly loaded substrate from a loading position to the processing position on the susceptor 426. Moving of lift pin contacts 442 up and down, or stationary positioning of them when the support moves up or down, causes the bottoms of the lift pins 433 to come into contact with the lift pin contacts 442, so that they stop moving downward while the support continues to move downward. The preheat ring 423 is removably disposed on a lower liner 440 that is coupled to the chamber body 402. The preheat ring 423 is disposed around the internal volume of the chamber body 402 and circumscribes the substrate 410 while the substrate 410 is in a processing position. The preheat ring 423 facilitates preheating of a process gas as the process gas enters the chamber body 402 through the plenum 420 adjacent to the preheat ring 423, and reduces the size of the opening between the upper and lower volumes of the chamber.

The central window portion 415 of the upper dome 416 and the bottom portion 417 of the lower dome 430 are formed from an optically transparent material such as quartz.

The processes described herein allow for selective growth of silicon germanium compounds on a substrate surface or surface of a layer previously formed thereon (e.g., materials, films, and/or layers) at low temperatures (e.g., about 450° C. or less), with almost complete selectivity to deposit on crystalline silicon surfaces at temperatures of about 400° C. or less, such as about 350° C. or less. The processes advantageously provide for boron concentrations of $1\times10^{15}$ atoms/cm$^3$ to about $5\times10^{21}$ atoms/cm$^3$ (such as from about $5\times10^{19}$ atoms/cm$^3$ to about $5\times10^{21}$ atoms/cm$^3$, or from about $1\times10^{18}$ atoms/cm$^3$ to about $5\times10^{21}$ atoms/cm$^3$, or in the range from about $1\times10^{20}$ atoms/cm$^3$ to about $2.5\times10^{21}$ atoms/cm$^3$) in the deposited Si:Ge layer. Moreover, the use of a dopant, such as boron, advantageously allows for growth of epitaxial silicon germanium films at low temperatures.

It has been found that to achieve greater deposition or growth selectivity to crystalline layers than to polysilicon or amorphous layers in a silicon germanium epitaxial growth or deposition process at lower temperatures, high-order germanes or halogenated germanes, such as digermane, should be used as the germanium source. For example, germanium containing layers can be formed using digermane at temperatures down to approximately 300° C. Silicon sources such as disilane or lower-order silanes, such as silane and dichlorosilane can also be used to, in combination with a higher order germane precursor, deposit a SiGe material layer. These lower-order silanes do not grow or deposit silicon containing layers at temperatures below 400° C. if used alone, but can be used to grow or deposit silicon containing layers in conjunction with germanium deposition or growth when combined with high order germanes, such as digermane. Since the germanium growth by high order germanes, once tuned, can be selective against growth or deposition thereof on dielectrics, for example silicon based dielectrics, and lower-order silanes do not grow silicon on these silicon based dielectrics at low temperatures, the silicon and germanium deposition (such as digermane and disilane) process becomes a selective silicon germanium process at low temperatures. The silicon from silane does not initiate on a silicon material, a dielectric material, or both below about 400° C., but can initiate on the silicon, dielectric, or both below that temperature in the presence of Ge, but an etchant may be used in conjunction with the deposition source gases to remove that Si:Ge deposition which may initiate on the non-crystalline surfaces of the substrate. The germanium in the germane precursor can activate the silicon substrate such that silane reaction becomes possible at temperatures below 400° C.

Etchants can be co-flowed with the silicon and germanium sources to further improve deposition or growth selectivity. The etchants are not limited to hydrogen chloride, and can contain halogen, germanium, and/or silicon in the molecules. In situ doping of the deposited materials can be achieved at the same time by co-flowing dopant-containing species such as diborane (for p-type) and phosphine (for n-type) with the silicon sources and germanium sources.

A computer system may perform the instructions provided in a non-transitory computer readable medium. The non-transitory computer readable medium can contain instructions to perform the methods described herein. Alternately, the instructions to perform the methods described herein may be added to the non-transitory computer readable medium. The non-transitory computer readable medium can include instructions that cause a computer system to control a substrate processing apparatus to perform processes described herein. The substrate processing chamber can be a part of the substrate processing apparatus. The computer system can be connected to one or more of the substrate processing chamber, to valves that regulate the source gases, dopant gases, etchant gases, and to switches that regulate temperature and pressure of the various components of the substrate processing apparatus.

The present disclosure provides, among others, the following embodiments, each of which may be considered as optionally including any alternate embodiments:

Clause 1. A method of depositing a silicon germanium material on a substrate, comprising: positioning the substrate within a substrate processing chamber, the substrate having a dielectric material and a silicon containing single crystal thereon; maintaining the substrate at a temperature of about 450° C. or less; exposing the substrate to a process gas comprising: a silicon source gas, a germanium source gas, an etchant gas, a carrier gas, and at least one dopant source gas; and epitaxially and selectively depositing a first silicon germanium material on the substrate.

Clause 2. The method of clause 1, wherein the dopant source gas is a boron containing dopant source gas, a phosphorus containing dopant source gas, or an arsenic containing dopant source gas.

Clause 3. The method of clause 2, wherein the boron containing dopant source gas is diborane.

Clause 4. The method of any of clauses 1 to 3, wherein the etchant gas is one or more of HCl, HF, $Cl_2$, HBr, $Br_2$, $SiCl_4$, $SiHCl_3$, $SiH_2Cl_2$, $GeCl_4$, and $GeHCl_3$.

Clause 5. The method of any of clauses 1 to 4, wherein the silicon germanium material has a boron concentration in the doped SiGe material of from about $1\times10^{15}$ atoms/cm$^3$ to about $5\times10^{21}$ atoms/cm$^3$.

Clause 6. The method of any of clauses 1 to 5, wherein the substrate is heated to a temperature of about 400° C. or less.

Clause 7. The method of any of clauses 1 to 6, wherein the process gas comprises: the silicon source gas at a flow rate of from about 5 sccm to about 500 sccm; the germanium source gas at a flow rate of from about 0.1 sccm to about 100 sccm; the carrier gas at a flow rate of from about 1,000 sccm to about 60,000 sccm; and the dopant source gas at a flow rate of from about 0.01 sccm to about 3 sccm.

Clause 8. The method of any of clauses 1 to 7, further comprising: exposing the substrate to a second process gas comprising a second silicon source gas and a second germanium source gas; and epitaxially and selectively depositing a second silicon germanium material on the substrate.

Clause 9. The method of any of clauses 1 to 8, wherein the substrate processing chamber is pressurized to a pressure of from about 0.1 Torr to about 200 Torr.

Clause 10. A method of depositing a silicon germanium material on a substrate, comprising: positioning the substrate within a substrate processing chamber, the substrate having a dielectric material and a silicon germanium single crystal thereon; maintaining the substrate at a temperature of about 450° C. or less; exposing the substrate to a process gas comprising: a silicon source gas, a germanium source gas, an etchant gas, a carrier gas, and at least one dopant source gas comprising a boron containing dopant source gas or a phosphorus containing dopant source gas; and epitaxially and selectively depositing a silicon germanium material on the substrate, the silicon germanium material having a resistivity of 0.3 mΩ·cm.

Clause 11. The method of clause 10, wherein the boron containing dopant source gas is diborane.

Clause 12. The method of clause 10 or 11, wherein the substrate is heated to a temperature of about 400° C. or less.

Clause 13. The method of any of clauses 10 to 12, wherein the silicon source gas is silane, dichlorosilane, or disilane.

Clause 14. The method of any of clauses 10 to 13, wherein the germanium source gas is digermane, trigermane, tetragermane, $GeCl_4$, or $GeHCl_3$.

Clause 15. The method of any of clauses 10 to 14, wherein the process gas comprises: the silicon source gas at a flow rate of from about 5 sccm to about 500 sccm; the germanium source gas at a flow rate of from about 0.1 sccm to about 100 sccm; the carrier gas at a flow rate of from about 1,000 sccm to about 60,000 sccm; and the dopant source gas at a flow rate of from about 0.01 sccm to about 3 sccm.

Clause 16. The method of any of clauses 10 to 15, wherein the substrate processing chamber is pressurized to a pressure of from about 0.1 Torr to about 200 Torr.

Clause 17. A method of depositing a silicon germanium material on a substrate, comprising: positioning the substrate within a substrate processing chamber, the substrate having a dielectric material and a silicon containing single crystal thereon; maintaining the substrate at a temperature of 400° C. or less; exposing the substrate to a process gas comprising: a silicon source gas, a germanium source gas comprising germane or digermane, an etchant gas comprising one or more of HCl, HF, $Cl_2$, HBr, $Br_2$, $SiCl_4$, $SiHCl_3$, $SiH_2Cl_2$, $GeCl_4$, and $GeHCl_3$, a carrier gas, and a dopant source gas comprising diborane; and epitaxially and selectively depositing a first silicon germanium material on the substrate.

Clause 18. The method of clause 17, wherein the silicon source gas is silane, dichlorosilane, or disilane.

Clause 19. The method of clause 17 or clause 18, wherein the process gas comprises: the silicon source gas at a flow rate of from about 5 sccm to about 500 sccm; the germanium source gas at a flow rate of from about 0.1 sccm to about 100 sccm; the carrier gas at a flow rate of from about 1,000 sccm to about 60,000 sccm; and the dopant source gas at a flow rate of from about 0.01 sccm to about 3 sccm.

Clause 20. The method of any of clauses 17 to 19, wherein the substrate processing chamber is pressurized to a pressure of from about 0.1 Torr to about 200 Torr.

Clause 21. A non-transitory computer readable medium that includes instructions that cause a computer system to control a substrate processing apparatus to perform a process, comprising: positioning the substrate within a substrate processing chamber, the substrate having a dielectric material and a silicon containing single crystal thereon; maintaining the substrate at a temperature of about 450° C. or less; exposing the substrate to a process gas comprising: a silicon source gas, a germanium source gas, an etchant gas, a carrier gas, and at least one dopant source gas; and epitaxially and selectively depositing a first silicon germanium material on the substrate.

Clause 22. The non-transitory computer readable medium of clause 21, wherein the dopant source gas is a boron containing dopant source gas, a phosphorus containing dopant source gas, or an arsenic containing dopant source gas.

Clause 23. The non-transitory computer readable medium of clause 22, wherein the boron containing dopant source gas is diborane.

Clause 24. The non-transitory computer readable medium of any of clauses 21 to 23, wherein the etchant gas is one or more of HCl, HF, $Cl_2$, HBr, $Br_2$, $SiCl_4$, $SiHCl_3$, $SiH_2Cl_2$, $GeCl_4$, and $GeHCl_3$.

Clause 25. The non-transitory computer readable medium of any of clauses 21 to 24, wherein the silicon germanium material has a boron concentration in the doped SiGe material of from about $1 \times 10^{15}$ atoms/cm$^3$ to about $5 \times 10^{21}$ atoms/cm$^3$.

Clause 26. The non-transitory computer readable medium of any of clauses 21 to 25, wherein the substrate is heated to a temperature of about 400° C. or less.

Clause 27. The non-transitory computer readable medium of any of clauses 21 to 26, wherein the process gas comprises: the silicon source gas at a flow rate of from about 5 sccm to about 500 sccm; the germanium source gas at a flow rate of from about 0.1 sccm to about 100 sccm; the carrier gas at a flow rate of from about 1,000 sccm to about 60,000 sccm; and the dopant source gas at a flow rate of from about 0.01 sccm to about 3 sccm.

Clause 28. The non-transitory computer readable medium of any of clauses 21 to 27, further comprising: exposing the substrate to a second process gas comprising a second silicon source gas and a second germanium source gas; and epitaxially and selectively depositing a second silicon germanium material on the substrate.

Clause 29. The non-transitory computer readable medium of any of clauses 21 to 28, wherein the substrate processing chamber is pressurized to a pressure of from about 0.1 Torr to about 200 Torr.

Clause 30. A non-transitory computer readable medium that includes instructions that cause a computer system to control a substrate processing apparatus to perform a process, comprising: positioning the substrate within a substrate processing chamber, the substrate having a dielectric material and a silicon germanium single crystal thereon; maintaining the substrate at a temperature of about 450° C. or less; exposing the substrate to a process gas comprising: a silicon source gas, a germanium source gas, an etchant gas, a carrier gas, and at least one dopant source gas comprising a boron containing dopant source gas or a phosphorus containing dopant source gas; and epitaxially and selectively depositing a silicon germanium material on the substrate, the silicon germanium material having a resistivity of 0.3 mΩ·cm.

Clause 31. The non-transitory computer readable medium of clause 30, wherein the boron containing dopant source gas is diborane.

Clause 32. The non-transitory computer readable medium of clause 30 or clause 31, wherein the substrate is heated to a temperature of about 400° C. or less.

Clause 33. The non-transitory computer readable medium of any of clauses 30 to 32, wherein the silicon source gas is silane, dichlorosilane, or disilane.

Clause 34. The non-transitory computer readable medium of any of clauses 30 to 33, wherein the germanium source gas is digermane, trigermane, tetragermane, $GeCl_4$, or $GeHCl_3$.

Clause 35. The non-transitory computer readable medium of any of clauses 30 to 34, wherein the process gas comprises: the silicon source gas at a flow rate of from about 5 sccm to about 500 sccm; the germanium source gas at a flow rate of from about 0.1 sccm to about 100 sccm; the carrier gas at a flow rate of from about 1,000 sccm to about 60,000 sccm; and the dopant source gas at a flow rate of from about 0.01 sccm to about 3 sccm.

Clause 36. The non-transitory computer readable medium of any of clauses 30 to 35, wherein the substrate processing chamber is pressurized to a pressure of from about 0.1 Torr to about 200 Torr.

Clause 37. A non-transitory computer readable medium that includes instructions that cause a computer system to control a substrate processing apparatus to perform a process, comprising: positioning the substrate within a substrate processing chamber, the substrate having a dielectric material and a silicon containing single crystal thereon; maintaining the substrate at a temperature of 400° C. or less; exposing the substrate to a process gas comprising: a silicon source gas, a germanium source gas comprising germane or digermane, an etchant gas comprising one or more of HCl, HF, $Cl_2$, HBr, $Br_2$, $SiCl_4$, $SiHCl_3$, $SiH_2Cl_2$, $GeCl_4$, and $GeHCl_3$, a carrier gas, and a dopant source gas comprising diborane; and epitaxially and selectively depositing a first silicon germanium material on the substrate.

Clause 38. The non-transitory computer readable medium of clause 37, wherein the silicon source gas is silane, dichlorosilane, or disilane.

Clause 39. The non-transitory computer readable medium of clause 37 or clause 38, wherein the process gas comprises: the silicon source gas at a flow rate of from about 5 sccm to about 500 sccm; the germanium source gas at a flow rate of from about 0.1 sccm to about 100 sccm; the carrier gas at a flow rate of from about 1,000 sccm to about 60,000 sccm; and the dopant source gas at a flow rate of from about 0.01 sccm to about 3 sccm.

Clause 40. The non-transitory computer readable medium of any of clauses 37 to 39, wherein the substrate processing chamber is pressurized to a pressure of from about 0.1 Torr to about 200 Torr.

While the foregoing is directed to embodiments of the present disclosure, other and further embodiments of the disclosure may be devised without departing from the basic scope thereof, and the scope thereof is determined by the claims that follow.

What is claimed is:

1. A method of depositing a silicon germanium material on a substrate, comprising:
    positioning the substrate within a substrate processing chamber, the substrate having a dielectric material and a silicon containing single crystal thereon;
    maintaining the substrate at a temperature of about 350° C. or less;
    co-flowing a process gas and an etchant gas into the substrate processing chamber, the process gas comprising a silicon source gas, a germanium source gas, a carrier gas, and a dopant source gas;
    exposing the substrate to the process gas and the etchant gas; and
    epitaxially and selectively depositing a first silicon germanium material on the substrate.

2. The method of claim 1, wherein the dopant source gas is a boron containing dopant source gas, a phosphorus containing dopant source gas, or an arsenic containing dopant source gas.

3. The method of claim 2, wherein the boron containing dopant source gas is diborane.

4. The method of claim 1, wherein the etchant gas is one or more of HCl, HF, $Cl_2$, HBr, $Br_2$, $SiCl_4$, $SiHCl_3$, $SiH_2Cl_2$, $GeCl_4$, and $GeHCl_3$.

5. The method of claim 1, wherein the first silicon germanium material has a boron, phosphorous, or arsenic concentration from about $1 \times 10^{15}$ atoms/cm$^3$ to about $5 \times 10^{21}$ atoms/cm$^3$.

6. The method of claim 1, wherein the process gas comprises:
    the silicon source gas at a flow rate from about 5 sccm to about 500 sccm;
    the germanium source gas at a flow rate from about 0.1 sccm to about 100 sccm;
    the carrier gas at a flow rate from about 1,000 sccm to about 60,000 sccm; and
    the dopant source gas at a flow rate from about 0.01 sccm to about 3 sccm.

7. The method of claim 1, further comprising:
    exposing the substrate to a second process gas comprising a second silicon source gas and a second germanium source gas; and
    epitaxially and selectively depositing a second silicon germanium material on the substrate.

8. The method of claim 1, wherein the substrate processing chamber is pressurized to a pressure from about 0.1 Torr to about 200 Torr.

9. A method of depositing a silicon germanium material on a substrate, comprising:
    positioning the substrate within a substrate processing chamber, the substrate having a dielectric material and a silicon germanium single crystal thereon;
    maintaining the substrate at a temperature of about 350° C. or less;
    co-flowing a process gas and an etchant gas into the substrate processing chamber, the process gas comprising a silicon source gas, a germanium source gas, a carrier gas, and a dopant source gas;
    exposing the substrate to the process gas and the etchant gas; and
    epitaxially and selectively depositing the silicon germanium material on the substrate, the silicon germanium material having a resistivity of about 0.3 mΩ·cm.

10. The method of claim 9, wherein the dopant source gas is diborane.

11. The method of claim 9, wherein the substrate is maintained at a temperature of about 300° C. or less.

12. The method of claim 9, wherein the silicon source gas is silane, dichlorosilane, or disilane.

13. The method of claim 9, wherein the germanium source gas is digermane, trigermane, tetragermane, $GeCl_4$, or $GeHCl_3$.

14. The method of claim 9, wherein the process gas comprises:
    the silicon source gas at a flow rate from about 5 sccm to about 500 sccm;
    the germanium source gas at a flow rate from about 0.1 sccm to about 100 sccm;
    the carrier gas at a flow rate from about 1,000 sccm to about 60,000 sccm; and
    the dopant source gas at a flow rate from about 0.01 sccm to about 3 sccm.

15. The method of claim 9, wherein the substrate processing chamber is pressurized to a pressure from about 0.1 Torr to about 200 Torr.

16. The method of claim 9, wherein the dopant source gas is a boron containing dopant source gas, a phosphorus containing dopant source gas, or an arsenic containing dopant source gas.

17. A non-transitory computer readable medium that includes instructions that cause a computer system to control a substrate processing apparatus to perform a process, comprising:

positioning a substrate within a substrate processing chamber, the substrate having a dielectric material and a silicon containing single crystal thereon;

maintaining the substrate at a temperature of about 350° C. or less;

co-flowing a process gas and an etchant gas into the substrate processing chamber, the process gas comprising a silicon source gas, a germanium source gas, a carrier gas, and a dopant source;

exposing the substrate to the process gas and the etchant gas; and epitaxially and selectively depositing a first silicon germanium material on the substrate.

18. The non-transitory computer readable medium of claim 17, wherein the dopant source gas is a boron containing dopant source gas, a phosphorus containing dopant source gas, or an arsenic containing dopant source gas.

19. The non-transitory computer readable medium of claim 18, wherein the boron containing dopant source gas is diborane.

20. The non-transitory computer readable medium of claim 17, wherein the etchant gas comprises one or more of HF, $Cl_2$, HBr, $Br_2$, $SiCl_4$, $SiHCl_3$, $SiH_2Cl_2$, $GeCl_4$, or $GeHCl_3$.

21. The non-transitory computer readable medium of claim 17, wherein:

the silicon source gas is silane, dichlorosilane, or disilane;

the germanium source gas is digermane, trigermane, tetragermane, $GeCl_4$, or $GeHCl_3$; or combinations thereof.

* * * * *